(12) United States Patent
Danny Koh et al.

(10) Patent No.: US 11,296,000 B2
(45) Date of Patent: Apr. 5, 2022

(54) FORMATION OF CONDUCTIVE CONNECTION TRACKS IN PACKAGE MOLD BODY USING ELECTROLESS PLATING

(71) Applicant: Infineon Technologies AG, Neubiberg (DE)

(72) Inventors: Cher Hau Danny Koh, Malacca (MY); Norliza Morban, Melaka (MY); Yong Chern Poh, Malacca (MY); Khay Chwan Saw, Melaka (MY); Si Hao Vincent Yeo, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/929,813

(22) Filed: Jul. 15, 2020

(65) Prior Publication Data

US 2020/0350222 A1 Nov. 5, 2020

Related U.S. Application Data

(63) Continuation of application No. 15/816,471, filed on Nov. 17, 2017, now Pat. No. 10,741,466.

(51) Int. Cl.
*H01L 23/48* (2006.01)
*H01L 23/31* (2006.01)
(Continued)

(52) U.S. Cl.
CPC .... *H01L 23/3107* (2013.01); *H01L 21/76874* (2013.01); *H01L 23/3121* (2013.01);
(Continued)

(58) Field of Classification Search
CPC ............ H01L 23/3107; H01L 23/3121; H01L 23/482; H01L 23/49537; H01L 23/49575; H01L 2224/48247; H01L 2924/181
(Continued)

(56) References Cited

U.S. PATENT DOCUMENTS 5,437,915 A 8/1995 Nishimura et al.
5,554,886 A * 9/1996 Song .................. H01L 23/4951
257/666

(Continued)

FOREIGN PATENT DOCUMENTS

CN 101930958 A 12/2010
EP 1775767 A2 4/2007
(Continued)

OTHER PUBLICATIONS

Saw, Khay Chwan, et al., "Chip to Chip Interconnect in Encapsulant of Molded Semiconductor Package", U.S. Appl. No. 16/375,479, filed Apr. 4, 2019, 1-27.
(Continued)

*Primary Examiner* — Nitin Parekh
(74) *Attorney, Agent, or Firm* — Murphy, Bilak & Homiller, PLLC

(57) ABSTRACT

An electronic circuit includes a first packaged semiconductor device having a first semiconductor die including a first terminal, a first electrically conductive lead that is electrically connected to the first terminal, and a first electrically insulating mold compound that encapsulates the first semiconductor die and exposes an end portion of the first lead at an outer surface of the first mold compound. A conductive track is formed in the outer surface of the first mold compound.

7 Claims, 10 Drawing Sheets

(51) Int. Cl.
*H01L 23/482* (2006.01)
*H01L 21/768* (2006.01)
*H01L 23/528* (2006.01)
*H01L 25/00* (2006.01)
*H01L 23/00* (2006.01)
*H01L 23/495* (2006.01)

(52) U.S. Cl.
CPC ...... *H01L 23/482* (2013.01); *H01L 23/49537* (2013.01); *H01L 23/49575* (2013.01); *H01L 23/528* (2013.01); *H01L 23/564* (2013.01); *H01L 25/50* (2013.01); *H01L 2224/05553* (2013.01); *H01L 2224/05554* (2013.01); *H01L 2224/48091* (2013.01); *H01L 2224/48247* (2013.01); *H01L 2924/181* (2013.01)

(58) Field of Classification Search
USPC .................................. 257/773, 666, 686
See application file for complete search history.

(56) References Cited

U.S. PATENT DOCUMENTS

| | | | |
|---|---|---|---|
| 5,602,420 A * | 2/1997 | Ogata | H01L 25/105 257/686 |
| 5,656,856 A * | 8/1997 | Kweon | H01L 25/105 257/686 |
| 5,729,433 A | 3/1998 | Mok | |
| 5,835,988 A * | 11/1998 | Ishii | H01L 23/49555 257/684 |
| 6,169,323 B1 | 1/2001 | Sakamoto | |
| 6,424,031 B1 * | 7/2002 | Glenn | H01L 25/0657 257/676 |
| 6,479,322 B2 | 11/2002 | Kawata et al. | |
| 6,534,876 B1 | 3/2003 | Glenn | |
| 7,633,765 B1 | 12/2009 | Scanlan et al. | |
| 7,944,034 B2 | 5/2011 | Gerber et al. | |
| 8,026,589 B1 | 9/2011 | Kim et al. | |
| 8,759,956 B2 | 6/2014 | Soller | |
| 9,224,688 B2 | 12/2015 | Chuang et al. | |
| 9,230,883 B1 | 1/2016 | Hiner et al. | |
| 9,559,064 B2 | 1/2017 | Chen et al. | |
| 9,564,409 B2 | 2/2017 | Seddon et al. | |
| 10,217,728 B2 | 2/2019 | Appelt et al. | |
| 10,264,664 B1 | 4/2019 | Vinciarelli et al. | |
| 2004/0061213 A1 | 4/2004 | Karnezos | |
| 2004/0227251 A1 | 11/2004 | Yamaguchi | |
| 2005/0067680 A1 | 3/2005 | Boon et al. | |
| 2005/0167814 A1 | 8/2005 | Beroz et al. | |
| 2007/0080437 A1 | 4/2007 | Marimuthu et al. | |
| 2007/0257340 A1 | 11/2007 | Briggs et al. | |
| 2008/0272464 A1 | 11/2008 | Do et al. | |
| 2008/0272477 A1 | 11/2008 | Do et al. | |
| 2009/0206458 A1* | 8/2009 | Andrews, Jr. | H01L 25/105 257/676 |
| 2009/0230487 A1 | 9/2009 | Saitoh et al. | |
| 2009/0321956 A1 | 12/2009 | Sasaki et al. | |
| 2010/0044808 A1 | 2/2010 | Dekker et al. | |
| 2010/0096737 A1 | 4/2010 | Chua | |
| 2010/0207257 A1 | 8/2010 | Lee | |
| 2011/0095417 A1 | 4/2011 | Tangpuz et al. | |
| 2011/0221005 A1 | 9/2011 | Luo et al. | |
| 2012/0108013 A1 | 5/2012 | Fujisawa et al. | |
| 2012/0217643 A1 | 8/2012 | Pagaila et al. | |
| 2012/0217644 A1 | 8/2012 | Pagaila | |
| 2013/0050227 A1 | 2/2013 | Petersen et al. | |
| 2013/0280826 A1 | 10/2013 | Scanlan et al. | |
| 2014/0332942 A1 | 11/2014 | Kanemoto | |
| 2015/0187608 A1 | 7/2015 | Ganesan et al. | |
| 2015/0279778 A1 | 10/2015 | Camacho et al. | |
| 2015/0380384 A1 | 12/2015 | Williams et al. | |
| 2016/0005675 A1 | 1/2016 | Tong | |
| 2016/0155728 A1 | 6/2016 | Zhao et al. | |
| 2017/0092567 A1 | 3/2017 | Vincent et al. | |
| 2017/0125355 A1 | 5/2017 | Su et al. | |
| 2017/0256472 A1 | 9/2017 | Chan et al. | |
| 2017/0256509 A1 | 9/2017 | Lee et al. | |
| 2017/0317015 A1 | 11/2017 | Lee et al. | |
| 2018/0124922 A1 | 5/2018 | Ji et al. | |
| 2018/0211946 A1 | 7/2018 | Shiu | |
| 2018/0342434 A1 | 11/2018 | Ziglioli | |
| 2018/0358292 A1 | 12/2018 | Kong et al. | |
| 2019/0115287 A1 | 4/2019 | Derai et al. | |
| 2019/0259629 A1 | 8/2019 | Ziglioli | |
| 2020/0185293 A1 | 6/2020 | Schmalzl et al. | |
| 2020/0203264 A1 | 6/2020 | Ziglioli | |

FOREIGN PATENT DOCUMENTS

| | | |
|---|---|---|
| KR | 20120056624 A | 6/2012 |
| WO | 2010080068 A1 | 7/2010 |

OTHER PUBLICATIONS

Unknown, Author, "Dual Exposed Pad PKG", Amkor Technology, 2010, 1-4.

Unknown, Author, "EpoxyClay Steel", Pioneer Adhesives, Inc., Accessed online at http://www.pioneer-adhesives.com/product/epoxyclay-steel on Dec. 11, 2018, 1-2.

Unknown, Author, "Laser-Direct-Structuring (LDS) of 3D-MIDs", LPKF Laser & Electronics AG, https://www.youtube.com/watch?v=VLL9NEA-9PI, Jun. 14, 2010.

Unknown, Author, "MicroLeadFrame® (MLF | QFN | VQFN | LFCSP | DFN | LPCC)", Amkor Technology, https://www.amkor.com/go/qfn, accessed Aug. 10, 2017, 1-3.

Unknown, Author, "Polymer Clay FAQ", Polymer Clay Web, 2011, Accessed online at http://www.polymerclayweb.com/faq.aspx on Dec. 7, 2018, 1-5.

Unknown, Author, "SO8-FL (Flat Lead) Power Discrete", Amkor Technology, https://www.amkor.com/go/packaging/allpackages/so8/so8flflatleadpowerdiscrete, accessed Aug. 10, 2017, 1-2.

Unknown, Author, "This is Mouldable Glue", Sugru, Accessed online at https://sugru.com/about on Dec. 7, 2018, 1-9.

Unknown, Author, "TSON8-FL (Flat Lead) Power Discrete", Amkor Technology, https://www.amkor.com/go/packaging/all-packages/tson8/tson8-fl-flat-lead-power-discrete, accessed Nov. 16, 2017, 1-2.

* cited by examiner

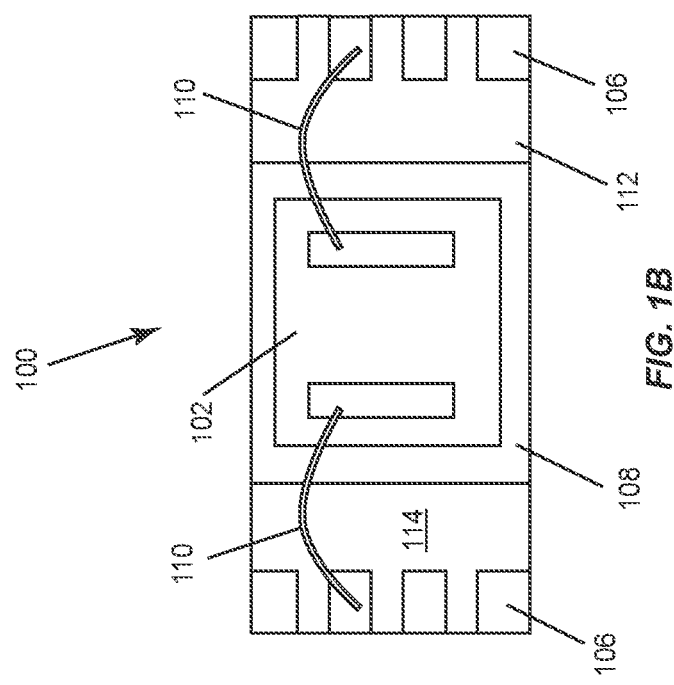
FIG. 1B
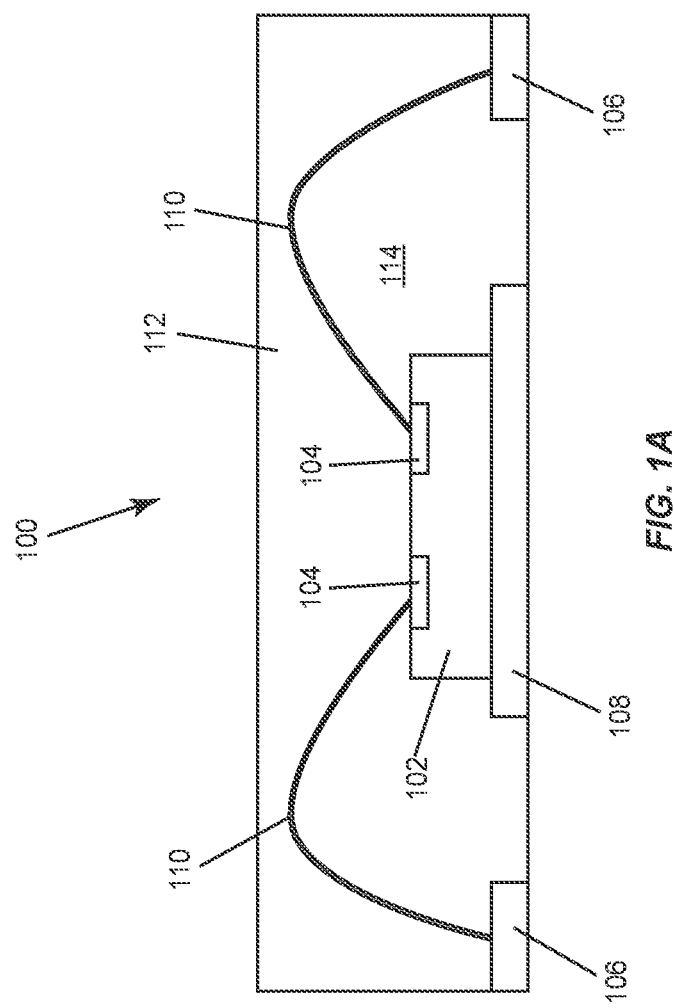
FIG. 1A
FIGURE 1

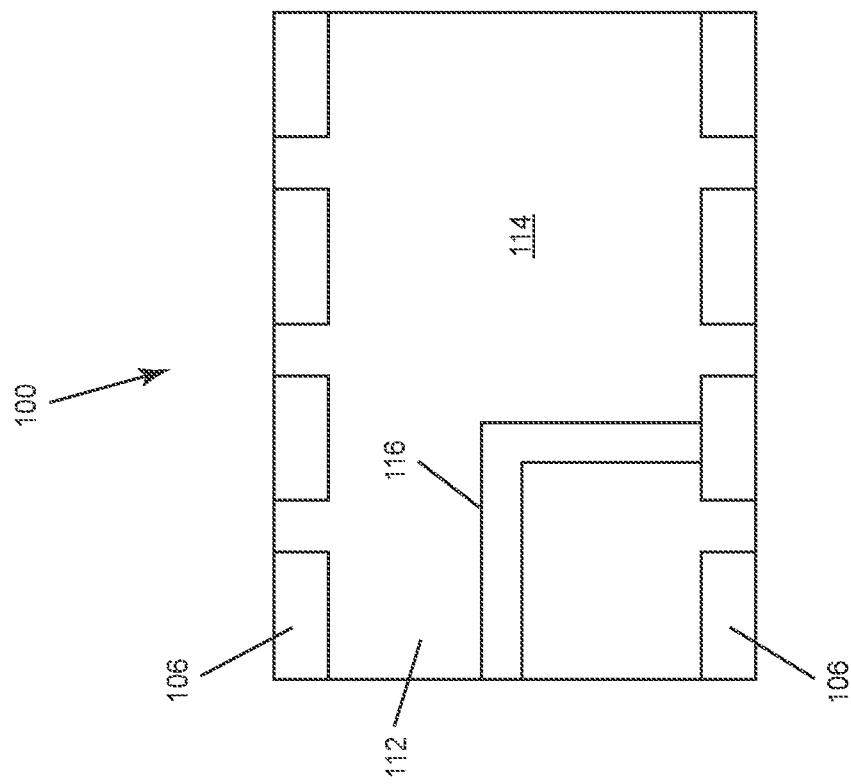
FIG. 2B
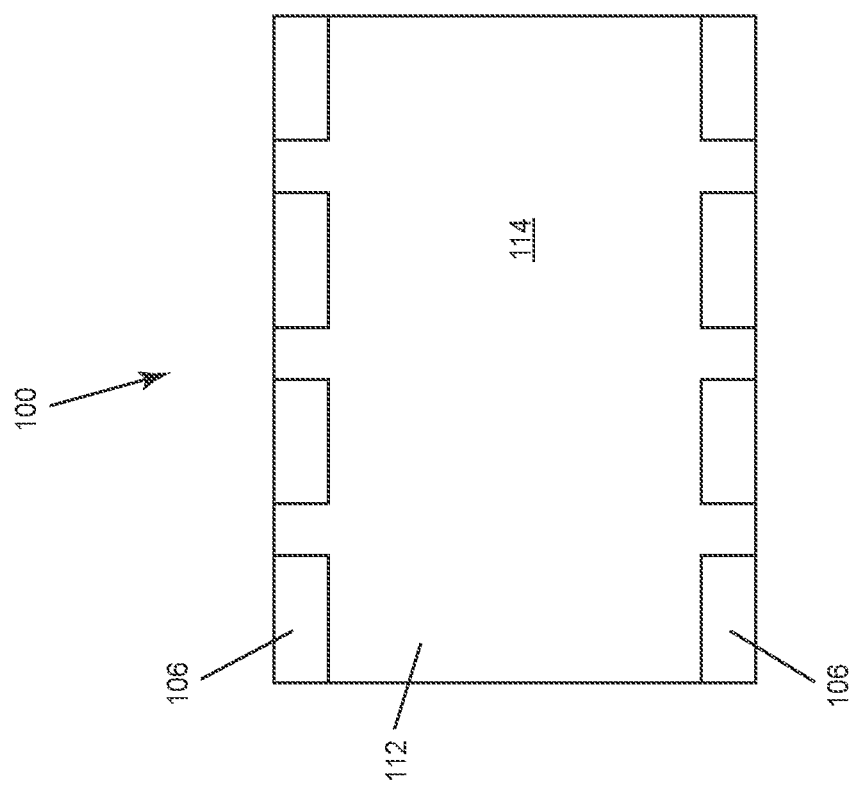
FIG. 2A
FIGURE 2

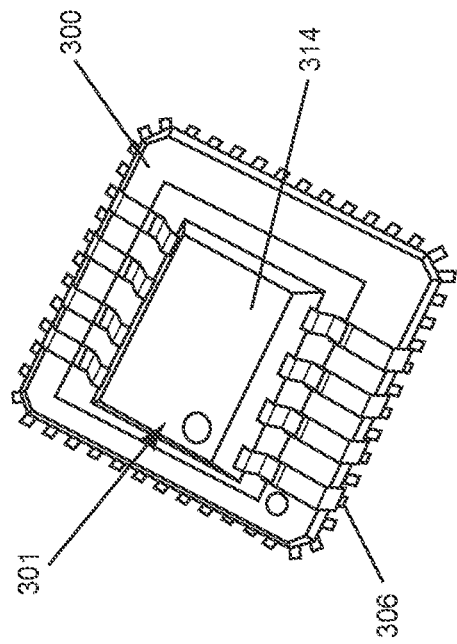
FIG. 10A
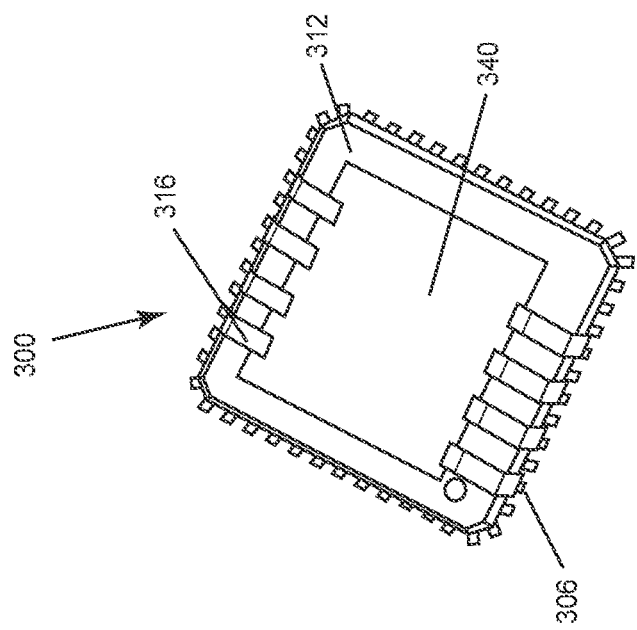
FIG. 10B
FIGURE 10

US 11,296,000 B2

FORMATION OF CONDUCTIVE CONNECTION TRACKS IN PACKAGE MOLD BODY USING ELECTROLESS PLATING

PRIORITY CLAIM

This application is a divisional of and claims priority to U.S. application Ser. No. 15/816,471 filed on Nov. 17, 2017, the content of which is incorporated by reference in its entirety.

TECHNICAL FIELD

The instant application relates to semiconductor devices, and in particular relates to techniques for electrically connecting one or more packaged semiconductor device together.

BACKGROUND

Integrated circuit devices, such as semiconductor chips, are commonly packaged using a lead frame and encapsulant material, such as a molding compound. For example, one or more semiconductor chips may be physically attached and electrically connected to a lead frame, e.g., using conductive bond wires. The encapsulant material is formed around the semiconductor chip and electrical connections. The encapsulant protects the semiconductor chip and electrical connections from damaging environmental conditions, such as moisture, temperature, foreign particles, etc. The leads of the lead frame are externally accessible from outside of the encapsulant material, and in some cases protrude away from the encapsulant material. These outer portions of the leads provide external electrical terminals that allow the packaged device to be electrically connected to a printed circuit board, for example.

Many semiconductor processing technologies utilize lead frame strips to simultaneously package a number of semiconductor devices. A lead frame strip includes a number of unit lead frames continuously repeated on a sheet conductor, with openings in the sheet conductor defining the features of the unit lead frames. Each unit lead frame provides the lead construction for a single packaged device. One or more semiconductor dies can be affixed to and electrically connected with each unit lead frame. The unit lead frames are singulated from one another to form individual packaged devices. The encapsulant material may be molded on the lead frame before or after the unit lead frames are singulated.

An important design consideration for many semiconductor applications is space efficiency. In many cases, the available space for a packaged semiconductor device is severely limited. Techniques for optimizing space efficiency include chip-stacking solutions. However, these techniques suffer from various drawbacks. For instance, direct stacking of chips within a package is limited by the available area of the die pad and the size of the semiconductor dies. Adequate cooling represents another challenge in these package styles, as only one of the two chips is in direct contact with the heat sink portion of the package (i.e., the die pad). Another solution involves the stacking of two distinct packaged semiconductor devices on top of one another. With stacked packaged devices, electrical interconnection between the two devices represents a notable challenge. Electrical connection between the two devices can be done using a so-called interposer. However, this interposer adds cost, complexity and increases the overall thickness of the design.

SUMMARY

A method of forming a semiconductor package is disclosed. According to an embodiment of the method, a first packaged semiconductor device is provided. The first packaged semiconductor device includes a first semiconductor die having a first terminal, a first electrically conductive lead that is electrically connected to the first terminal, and a first electrically insulating mold compound that encapsulates the first semiconductor die and exposes an end portion of the first lead at an outer surface of the first mold compound. A conductive track is formed in the outer surface of the first mold compound. Forming the conductive track includes activating a portion of the outer surface of the first mold compound for an electroless plating process, and performing the electroless plating process so as to form an electrically conductive material only within the activated portion of the outer surface of the first mold compound.

According to another embodiment of the method, a first packaged semiconductor device is provided. The first packaged semiconductor device includes a first semiconductor die having a first terminal, a first electrically conductive lead that is electrically connected to the first terminal, and a first electrically insulating mold compound that encapsulates the first semiconductor die and exposes an end portion of the first lead at an outer surface of the first mold compound. A conductive track is formed in the outer surface of the first mold compound. The first electrically insulating mold compound includes a multi-layer exterior compound that includes: a metallic ion containing layer, a hydrophilic layer disposed on the metallic ion containing layer, and a hydrophobic layer disposed on the hydrophilic layer.

An electronic circuit is disclosed. The electronic circuit includes a first packaged semiconductor device having a first semiconductor die including a first terminal, a first electrically conductive lead that is electrically connected to the first terminal, and a first electrically insulating mold compound that encapsulates the first semiconductor die and exposes an end portion of the first lead at an outer surface of the first mold compound. A conductive track is formed in the outer surface of the first mold compound.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A and 1B, illustrates a packaged semiconductor device, according to an embodiment. FIG. 1A depicts a side-view of the packaged semiconductor device and FIG. 1B depicts a plan-view of the packaged semiconductor device.

FIG. 2, which includes FIGS. 2A and 2B, illustrates forming a conductive track in the mold compound of the packaged semiconductor device. FIG. 2A depicts a bottom side of the packaged semiconductor device before forming the conductive track and FIG. 2B depicts a bottom side of the packaged semiconductor device after forming the conductive track.

FIG. 10, which includes FIGS. 10A and 10B, depicts a method for forming a multi-package stack with conductive tracks providing an electrical connection between the various packages of the multi-package stack. FIG. 10A depicts a first packaged semiconductor device with conductive tracks formed in the mold compound and FIG. 10B depicts a second packaged semiconductor affixed to the first packaged semiconductor device and electrically connected to the conductive tracks.

DETAILED DESCRIPTION

Figure 3:
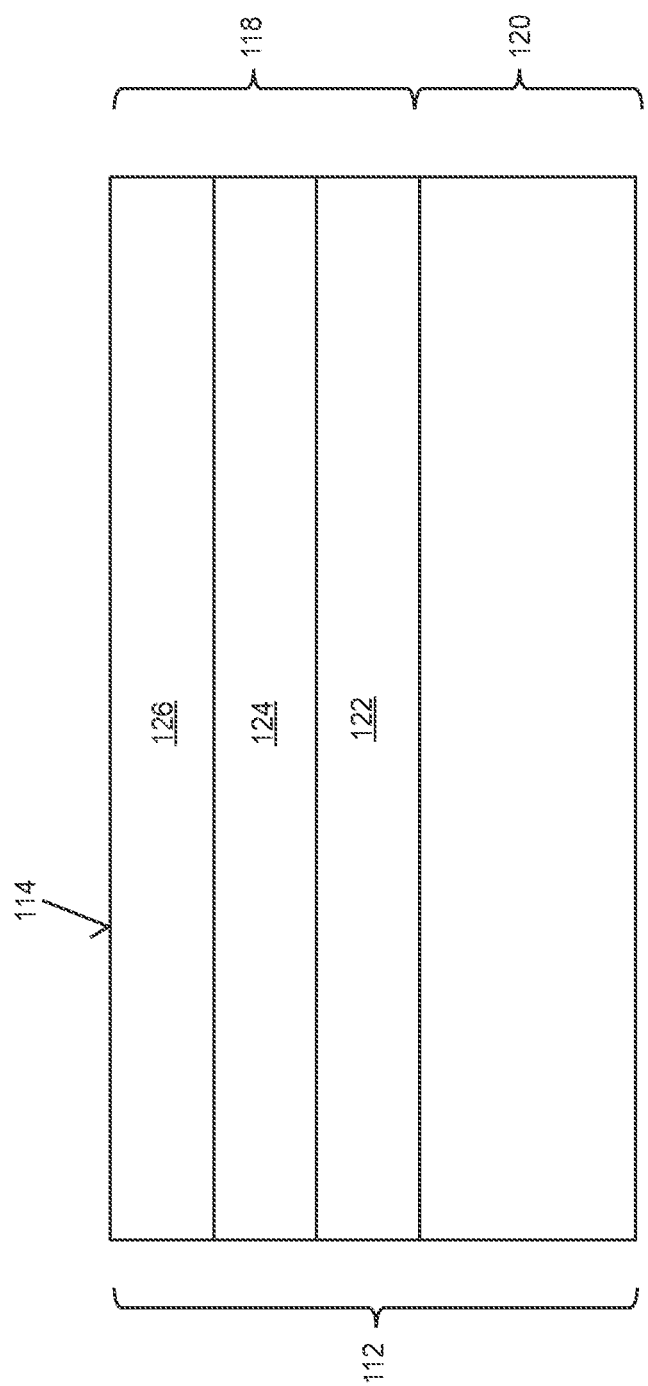
FIG. 3 depicts a close-up view of a multi-layer exterior mold compound that is configured for a laser structuring and electroless plating technique, according to an embodiment.

Embodiments described herein include a method of forming a conductive track in the mold body of a packaged semiconductor device. According to this technique, a packaged semiconductor device with an electrically insulating mold compound is provided. The mold compound encapsulates at least one semiconductor die and the associated electrical connections (e.g., wire bonds) between the semiconductor die and a first lead. A conductive track is formed in the electrically insulating mold compound.

By forming the conductive track in the mold body of a packaged semiconductor device according to the presently disclosed techniques, a variety of advantageously space efficient package designs are made possible. For example, the conductive tracks can be used to provide a compact package design whereby two opposite facing circuit assemblies are molded together in a single package. In this package, separate lead frames, which may be identical to one another, can be provided at top and bottom sides of the package. The die pads for the opposite facing semiconductor dies can be exposed at the top and bottom sides of the package. Thus, each semiconductor chip can be independently cooled using separate heat sinks. The conductive tracks can be formed to provide a vertical electrical connection between the top and bottom facing leads at the outside of the package. In another advantageous embodiment, two discrete packaged devices are directly adhered to one another. One of the packages includes the conductive tracks to provide electrical connection between the leads of both devices. The conductive tracks advantageously eliminate the need for an interposer, and thus reduce package thickness and cost.

Formation of the conductive track in the mold body of a packaged semiconductor device is made possible by a laser structuring process that activates the mold compound for an electroless plating process. According to this technique, the electrically insulating mold compound of the packaged device includes a multi-layer exterior compound that is specifically tailored for a laser structuring process. The multi-layer exterior includes a metallic ion containing layer, a hydrophilic layer disposed on the metallic ion containing layer, and a hydrophobic layer disposed on the hydrophilic layer. Through a sequence of laser patterning and etching, a structured portion of the metallic ion containing layer can be exposed to the exterior environment. After this sequence, an electrical conductor is formed in the structured portion of the multi-layer exterior compound using an electroless deposition process. In this way, the electrical conductor can be selectively formed in the activated portion of the mold compound without being formed on other surfaces of the mold compound.

Referring to FIG. 1, a packaged semiconductor device 100 is depicted, according to an embodiment. The packaged semiconductor device 100 includes a semiconductor die 102 having electrically conductive terminals 104, a plurality of electrically conductive leads 106, a die pad 108, and a plurality of electrical connections 110 between the leads 106 and the terminals 104 of the die. An electrically insulating mold compound 112 encapsulates the semiconductor die 102 and the electrical connections 110 and exposes end portions of the leads 106. In FIG. 1, a transparency view of the mold compound 112 is used so that the interior components of the packaged semiconductor device 100, i.e., the semiconductor die 102, the electrical connections 110, etc., can be seen.

In general, the semiconductor die 102 can be any active or passive electronic component. Examples of these devices include power semiconductor devices, such as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g., PIN diodes or Schottky diodes, etc. Other examples of these devices include logic devices, such as microcontrollers, e.g., memory circuits, level shifters, etc.

The terminals 104 of the semiconductor die 102 are externally accessible. These terminals 104 may include the input, output and control terminals of the device. For instance, in the example of a MOSFET device, the terminals 104 may include gate, source and drain terminals 104. These terminals 104 can have any of a wide variety of shape and configuration. These terminals 104 can be formed from electrical conductors such as Cu, Ni, NiSn, Au, Ag, Pt, Pd, In, Sn, and alloys thereof.

The semiconductor die 102 can be configured as a so-called lateral device. In this configuration, the semiconductor die 102 has its load terminals (e.g., source and drain terminals) disposed on a single main surface (e.g., as depicted) and is configured to conduct in a direction that is parallel to the main surface of the semiconductor die 102. Alternatively, the semiconductor die 102 can be configured as a so-called vertical device. In this configuration, the device has its load terminals 104 disposed on opposite facing main and rear surfaces and is configured to conduct in a direction that is perpendicular to the main and rear surfaces.

The die pad 108 and the leads 106 of the packaged semiconductor device 100 can be collectively provided from a lead frame. The die pad 108 serves as a chip carrier that physically supports and is adhered to the semiconductor die 102. Adhesion between the semiconductor die 102 and the die pad 108 can be provided by a wide variety of techniques including solder, adhesive tape, glue, etc. The electrically conductive leads 106 are physically separated and electrically isolated from one another and from the die pad 108. The lead frame that includes the leads 106 and the die pad 108 can be formed from any of a wide variety of electrically conductive materials, including copper, aluminum, and alloys thereof.

The electrical connections 110 between the terminals 104 the first semiconductor die 102 and the conductive leads 106 can be provided by electrically conductive bond wires. These bond wires may be attached and electrically connected to the semiconductor die 102 and the leads 106 using a solder material, for example. More generally, any of a variety of electrical connection techniques can be utilized to effectuate these electrical connections 110 including, e.g., conductive ribbons, PCB, conductive traces, etc.

Generally speaking, the electrically insulating mold compound 112 can include a wide variety of electrically insulating materials that are suitable for semiconductor packaging. Examples of these materials include thermoset materials or thermoplastic materials which special formulated with non-active metal. The non-active metal ions can be activated, e.g., using the laser activation process to be discussed below. Thermoplastic materials may include one or more materials selected from the group of polyetherimide (PEI), polyether-sulfone (PES), polyphenylene-sulfide (PPS), polyamide-imide (PAI), and polyethylene-terephthalate (PET). Thermoplastic materials may include one or more materials selected from the group of polyetherimide (PEI), polyether-sulfone (PES), polyphenylene-sulfide (PPS), polyamide-imide (PAI), and polyethylene-terephthalate (PET). Thermoplastic materials melt by application of pressure and heat during molding or lamination and (reversibly) harden upon cooling and pressure release.

The mold compound 112 encapsulates the first semiconductor die 102 and the electrical connections 110 between the first semiconductor die 102 and the leads 106. That is, the mold compound 112 encloses the first semiconductor die 102 and the electrical connections 110 such that these items are protected from the exterior environment. End portions of the leads 106 are exposed from the outer surface 114 of the mold compound 112. That is, the end portions of the leads 106 are externally accessible for electrical connection thereto from outside of the first packaged semiconductor device 100, e.g., from an external printed circuit board. Additionally, a lower side of the die pad 108 is exposed at the outer surface 114 of the mold compound 112. In this way, the die pad 108 can serve as an electrical terminal as well as a heat sink that is configured to transfer heat generated by the first semiconductor die 102 to an external apparatus, e.g., a heat sink provided in an external printed circuit board. In other embodiments, the lower side of the die pad 108 may be encapsulated by the mold compound 112.

Referring to FIG. 2, a conductive track 116 is formed in the outer surface 114 of the mold compound 112, according to an embodiment. In these figures, the mold compound 112 is opaque so that the interior components of the first packaged semiconductor device 100 are not visible.

Referring to FIG. 2A, a bottom side of the packaged semiconductor device 100 is shown. The bottom side includes the end portions of the leads 106 that are exposed from the mold compound 112. In this figure, the mold compound 112 is opaque so that the interior components of the first packaged semiconductor device 100 are not visible.

Referring to FIG. 2B, a conductive track 116 is formed in the outer surface 114 of the mold compound 112, according to an embodiment. The conductive track 116 includes an electrically conductive material that can provide a low-ohmic electrical connection. In the depicted embodiment, the conductive track 116 is formed to directly contact one of the leads 106. Thus, the conductive track 116 may, but does not necessarily, form an electrical connection with one of the terminals 104 of the semiconductor die 102 via by a lead 106 that is electrically connected to the semiconductor die 102. Alternatively, the conductive track 116 may form an electrical connection with an unassigned lead, i.e., a lead that is disconnected from the semiconductor die 102. According to yet another embodiment, the conductive track 116 is completely electrically isolated from all of the leads 106.

Referring to FIG. 3, a close up cross-sectional view of the mold compound 112 is depicted, according to an embodiment. This mold compound 112 is specifically formulated for a laser structuring and electroless plating process. The mold compound 112 includes a multi-layer exterior compound 118 that is formed on the base mold compound 120. The base mold compound 120 may include any of the aforementioned mold compound 112 materials that are conducive to a transfer or injection molding process, e.g., thermoset materials or thermoplastic materials.

The multi-layer exterior compound 118 includes a metallic ion containing layer 122 that is disposed on the base mold compound 120. The metallic ion containing layer 122 is a layer of mold material, e.g., plastic that includes metallic ions that are suitable for an electroless deposition process. For example, in one embodiment, the metallic ion layer 122 contains palladium ions ($Pd^{2+}$).

The multi-layer exterior compound 118 additionally includes a hydrophilic layer 124 disposed that is disposed on the metallic ion containing layer 122. A hydrophilic layer 124 refers to a layer that is dissolvable by a fluid such as a wet chemical etchant. Exemplary materials for the hydrophilic layer 124 include materials from the R—COOH carbonyl group.

The multi-layer exterior compound 118 additionally includes a hydrophobic layer 126 disposed on the that is disposed on the hydrophilic layer 124. A hydrophobic layer 126 refers to a layer that is resistant to dissolution or deterioration by a fluid such as a wet chemical etchant. Exemplary materials for the hydrophobic layer 126 include materials from the hydrocarbon group (CH4).

Figure 4:
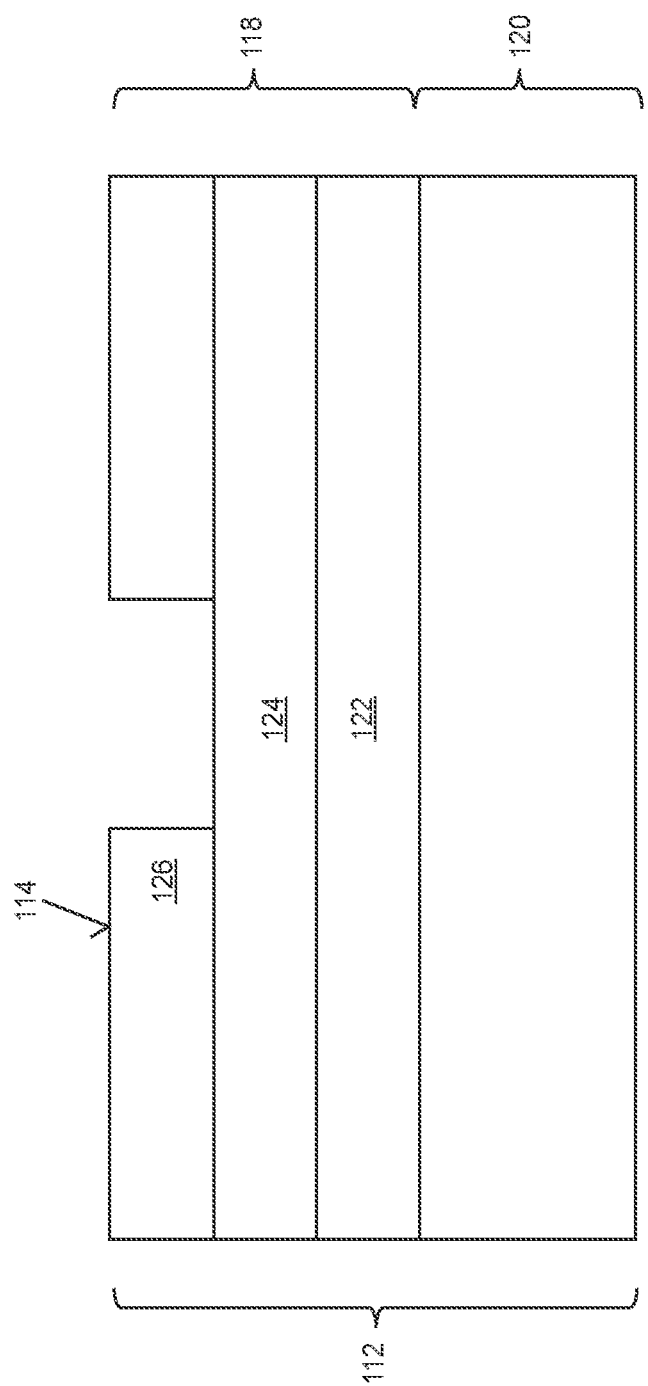
FIG. 4 depicts patterning the hydrophobic layer using a laser, according to an embodiment.

Referring to FIG. 4, the hydrophobic layer 126 is patterned. That is, a portion of the hydrophobic layer 126 is removed in a predefined geometry. In this way, an underlying portion of the hydrophilic layer 124 is exposed from the hydrophobic layer 126 in the patterned shape of the hydrophobic layer 126. According to an embodiment, this patterning is done using a laser. The laser process is carried out in such a way to completely remove the portion of the hydrophobic layer 126 without substantially removing the hydrophilic layer 124.

Figure 5:
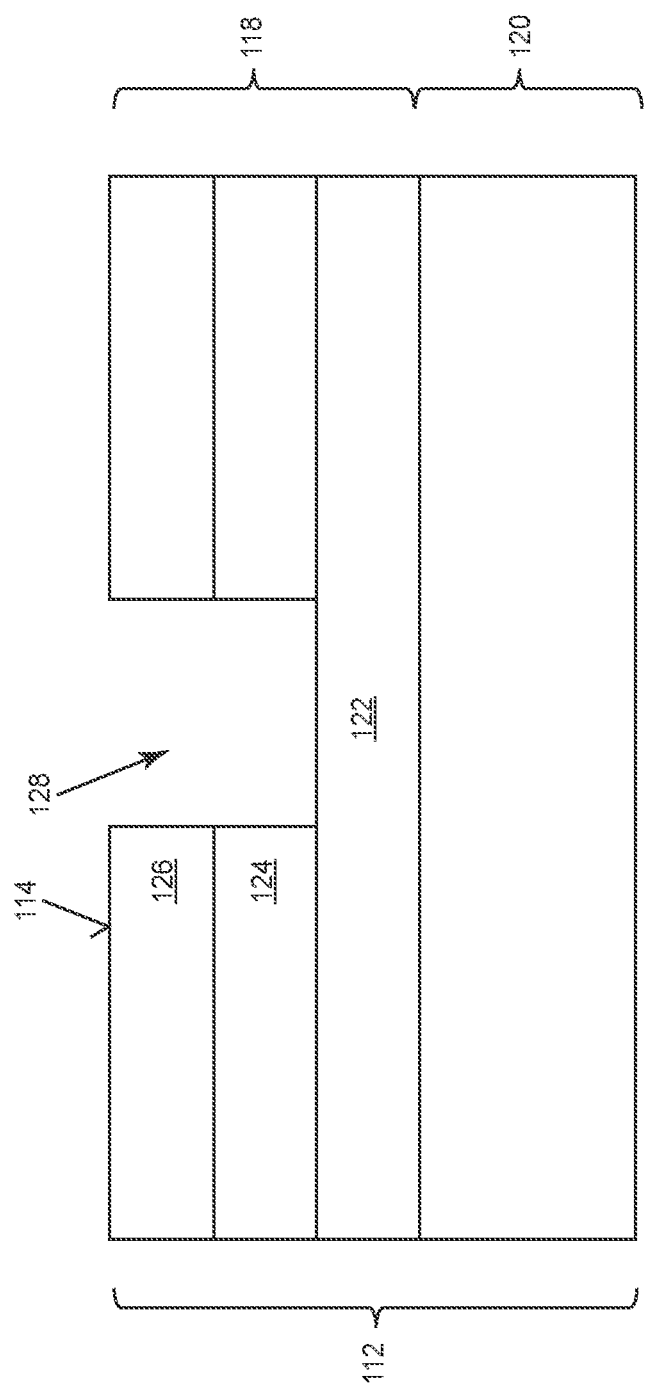
FIG. 5 depicts removing a portion of the hydrophilic layer that is exposed by the patterned hydrophobic layer, according to an embodiment.

Referring to FIG. 5, a portion of the hydrophilic layer 124 that is exposed by the patterned hydrophobic layer 126 is removed so as to expose a patterned region of the metallic ion containing layer 122. This removal step may be done using a wet chemical etch technique, wherein hydrophobic layer 126 acts as an etch mask, and the etch is selective to the material of the metallic ion containing layer 122. Exemplary chemical etchant materials include sodium hydroxide (NaOH) or potassium hydroxide (KOH).

As a result of the laser patterning and etching steps described with reference to FIGS. 4 and 5, a recessed channel 128 is formed in the outer surface 114 of the mold compound 112. A recessed channel 128 refers to a local depression in the mold compound 112 that is beneath the adjacent planar surfaces in the mold compound 112. The recessed channel 128 exposes the metallic ion containing layer 122 and therefore provides an activated portion of the mold compound 112 that is suitable for an electroless plating process. The sidewalls of this recessed channel 128 may be, but are not necessarily, parallel to one another.

Figure 6:
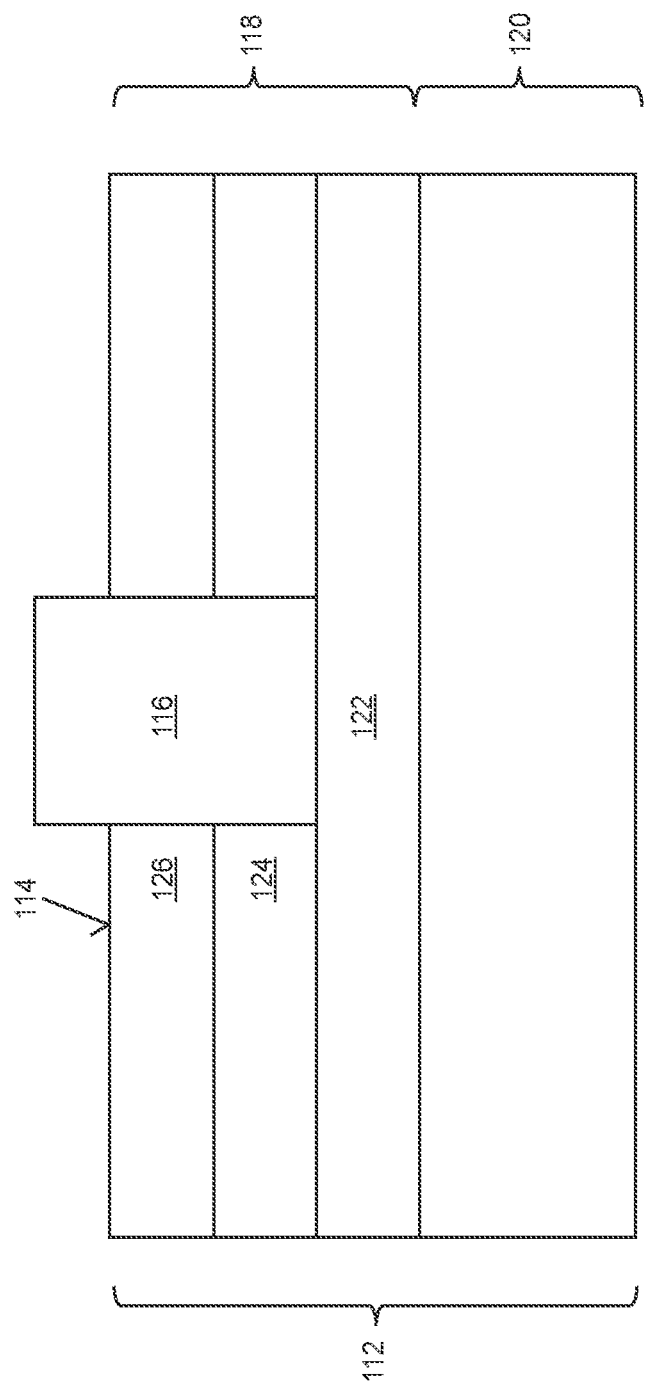
FIG. 6 depicts performing an electroless plating process to form a conductive track in a recessed portion of the multi-layer exterior mold compound, according to an embodiment.

Referring to FIG. 6, an electroless plating process is performed. As used herein, an electroless plating process refers to a process that utilizes a plating solution with a chemical reaction agent that reacts with metal ions in the plating solution to form a metal coating. By way of comparison, an electroless metal plating process differs from an electroplating technique, which utilizes a current source to attract metal ions to the article. In general, any of a variety of electroless plating processes can be formed to provide a conductive metal trace in the activated portion of the mold compound 112, i.e., the exposed portion of the metallic ion containing layer 122. These conductive materials can include a wide variety of metals, such as nickel, palladium, gold, silver, copper, and alloys thereof. According to an embodiment, the electroless plating process is a Nickel-Phosphorous (NiP) process, and more particularly, may be a Nickel-Molybdenum-Phosphorous (NiMoP) plating process. In this process, the packaged semiconductor device 100 is submerged in an electroless plating solution. Generally speaking, the plating solution can be any autocatalytic reducing agent that is chemically reactive with a metal ion. Examples include hydrated sodium hypophosphite ($NaPO_2H_2.H_2O$). In the case of an electroless Nickel-Molybdenum-Phosphorous (NiMoP) plating process, the plating solution can include a mixture of sodium hypophosphite and a solution containing nickel sulphate, molybdenum, boric acid and citric acid, such as an an M20 solution, which is made by BASF®. As a result of the chemical reaction that occurs between the metallic ion containing layer 122 and the electroless plating solution, a conductive metal, e.g., nickel-phosphorous forms in the recessed channel 128. Meanwhile, the conductive metal does not form on the mold compound 112 outside of the recessed channel 128, as these regions of the mold compound 112 are chemically inactive.

Advantageously, the laser structuring technique enables a wide variety of geometries and configurations for the conductive track 116. The number, orientation and geometry of the conductive track 116 (or tracks) can vary substantially. Moreover, the conductive track 116 may be formed on multiple faces of the mold compound 112. The only constraints placed on the geometry and configuration of the conductive track 116 are those imposed by the laser structuring process as described above. That is, the conductive track 116 can be formed in any shape that is feasible by the laser patterning and etching sequence. Various examples the conductive track 116 used in a multi-chip arrangement will be described in further detail below with reference to FIGS. 7-10.

Figure 7:
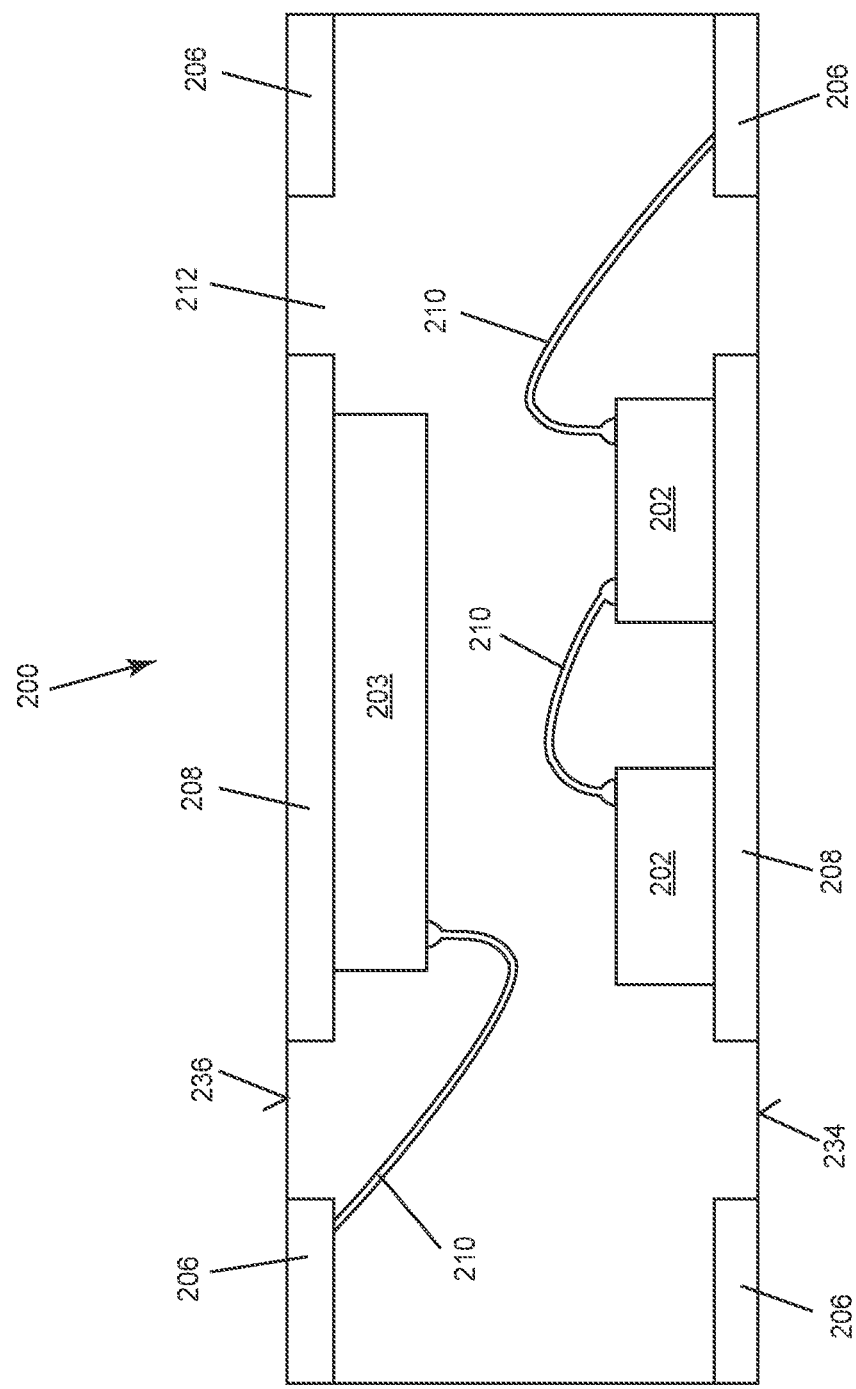
FIG. 7 depicts a side view of a multi-chip packaged semiconductor device, according to an embodiment.

Referring to FIG. 7, a packaged semiconductor device 200 is depicted. The packaged semiconductor device 200 includes first and second semiconductor dies 202, 203. Each of the first and second semiconductor die 202, 203 may be configured as the semiconductor dies 102 previously discussed with reference to FIG. 1. The packaged semiconductor device 200 includes first and second lead frames, with each of the first of the second lead frames containing a die pad 208 and a plurality of electrically conductive leads 206. These lead frames may be configured as the lead frame previously discussed with reference to FIG. 1. The first lead frame is disposed on a bottom side of the packaged semiconductor device 200 such that a lower side of the die pad 208 and the ends of leads 206 of the first lead frame are exposed at the bottom surface 234 of the mold compound 212. The second lead frame is disposed on a top side of the of the packaged semiconductor device 200 such that a lower side of the die pad 208 and the ends of leads 206 of the second lead frame are exposed at the top surface 236 of the mold compound 212. A first terminal of the first semiconductor die 102 is electrically connected to a lead 206 from the first lead frame, e.g., in a similar manner as previously described with reference to FIG. 1. A second terminal of the second semiconductor die 102 is electrically connected to a lead 206 from the second lead frame, e.g., in a similar manner as previously described with reference to FIG. 1.

In the packaged semiconductor device 200 of FIG. 7, the first and second semiconductor dies 202, 203 are vertically spaced apart from one another. That is, the upper surfaces of the first and second semiconductor dies 202, 203 that face one another do not contact one another at all. Instead, the mold compound 212 is provided between the upper surfaces of the first and second semiconductor dies 202, 203.

Figure 8:
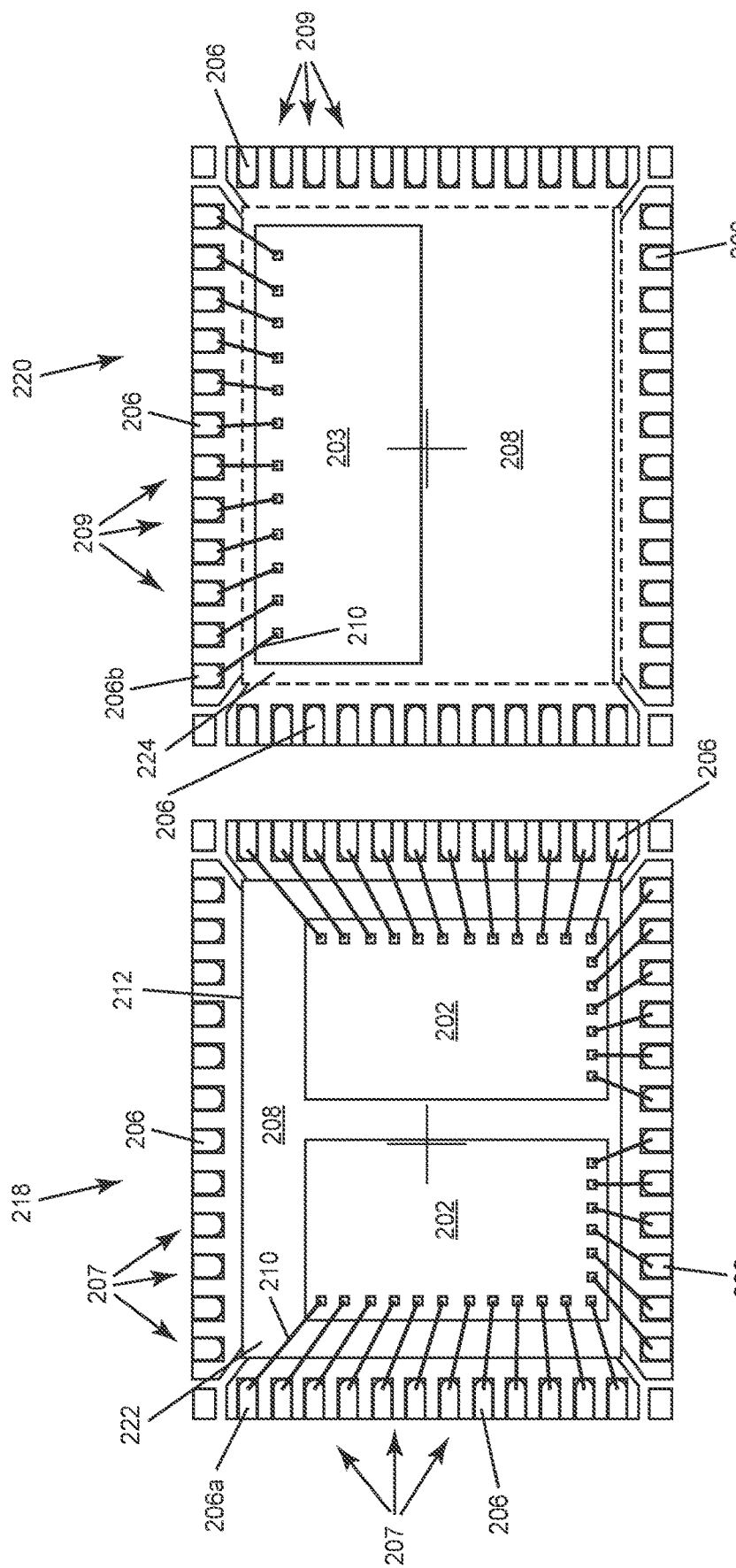
FIG. 8 depicts first and second circuit assemblies that include lead frames, semiconductor dies, and electrically conductive bond wires, according to an embodiment.

Referring to FIG. 8, a process step in a method for forming the packaged semiconductor device 200 of FIG. 7 is depicted. According to this method, first and second circuit assemblies 218, 220 are provided. The first circuit assembly includes a first lead frame 222 having the first die pad 208 and a first plurality 207 of the electrically conductive leads 206. A plurality of the electrical connections 210 is provided between the first semiconductor die 202 and some of the leads 206 in the first plurality 207. In particular, a first lead 206a in the first plurality 207 is electrically connected to the first terminal of the first semiconductor die 202 by one of the electrical connections 210. The second circuit assembly includes a second lead frame 224 having a second die pad 208 and a second plurality 209 of the electrically conductive leads 206. A plurality of the electrical connections 210 is provided between the second semiconductor die 203 and some of the leads 206 in the second plurality 209. In particular, a second lead 206b in the second plurality 207 is electrically connected to the second terminal of the second semiconductor die 203 by one of the electrical connections 210.

After the first and second circuit assemblies 218, 220 are provided in the above described manner, the second circuit assembly 220 is arranged above the first circuit assembly 210 such that the second semiconductor die 203 faces and is vertically spaced apart from the first semiconductor dies 202. That is, the first and second circuit assemblies 218, 220 are vertically stacked on top of one another, with the bottom side of the first lead frame 222 facing away from the bottom side of the first lead frame 222. In other words, the first and second semiconductor dies 202, 203 are sandwiched in-between the bottom sides of the first and second lead frames 222, 224. Moreover, the second circuit assembly is held in a position such that the second semiconductor die 203 does not contact the first semiconductor dies 202. According to one embodiment, the first circuit assembly 218 is provided using a pre-molded lead frame that includes a ring of electrically insulating mold compound 212 formed around the periphery of the first lead frame 222. This ring of electrically insulating mold compound 212 provides a support mechanism for the second lead frame 224 to rest upon when placed over the first lead frame 222, while maintaining a separation between the first and second semiconductor dies 202, 203.

Figure 9:
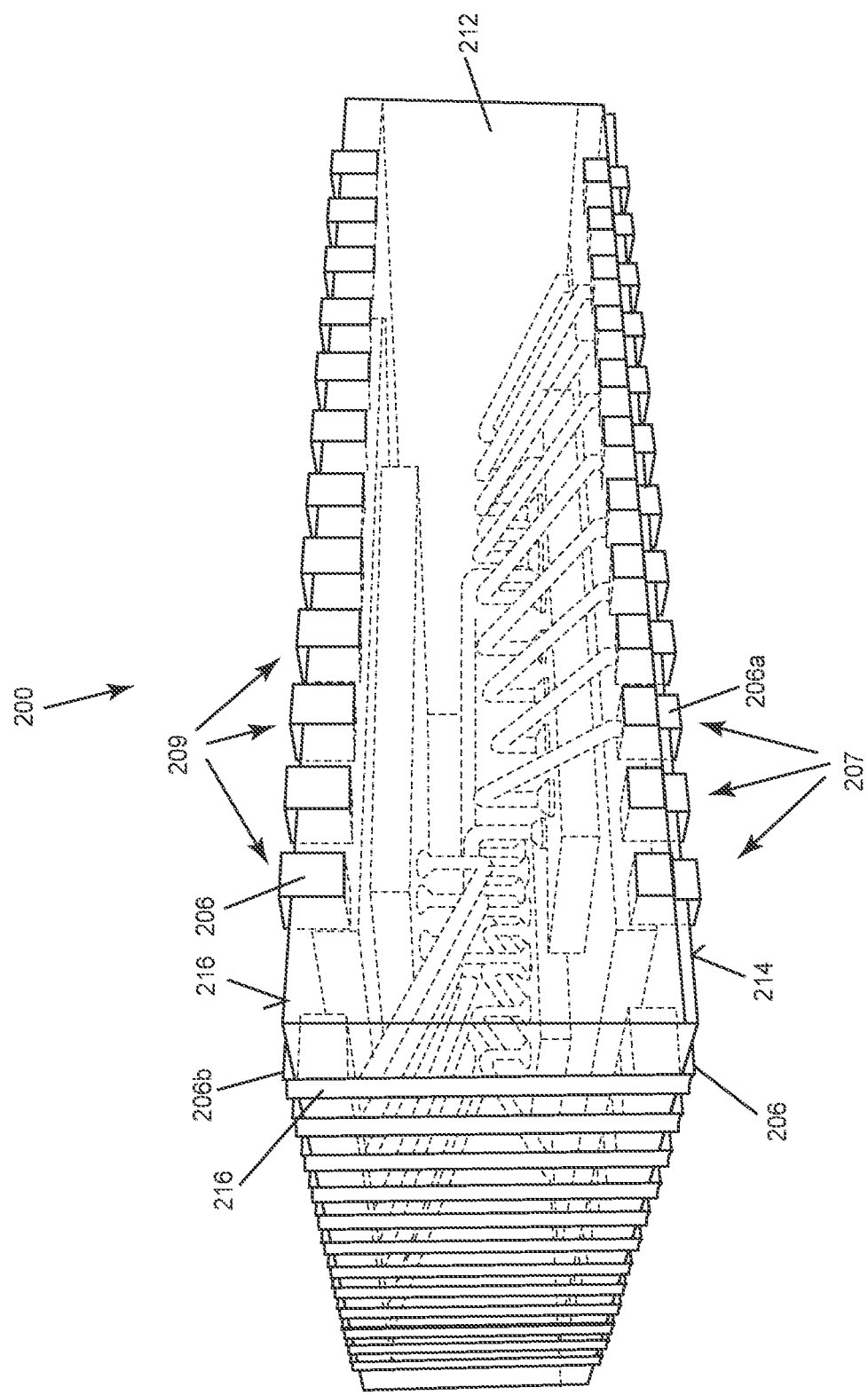
FIG. 9 depicts a side view of the multi-chip packaged semiconductor device with conductive tracks in the mold compound electrically connecting the leads of the first and second circuit assemblies, according to an embodiment.

Referring to FIG. 9, after the first and second circuit assembles are arranged on top of one another as described above, the mold compound 212 is formed over the first and second semiconductor dies 202, 203. The mold compound 212 can be formed according to any of a variety of techniques. According to an embodiment, a compression molding technique is used to form the mold compound 212 in this manner. The mold compound 212 is formed in such a way that the first and second semiconductor dies 202, 203 and the associated electrical connections 210 to the leads 206 are encapsulated by the mold compound 212. Meanwhile, portions of the first and second lead frame 222, 224 are exposed at the outer surface of the mold compound 212, e.g., in the manner previously described with reference to FIG. 7. Moreover, the mold compound 212 is formed to include the multi-layer exterior compound 118 as previously described with reference to FIG. 3.

After the mold compound 212 is formed, a laser structuring technique is performed in the manner previously described with reference to FIGS. 4-6. As a result, a plurality of conductive track 216 are formed. In this embodiment, the conductive tracks 216 are formed to extend along a sidewall of the mold compound 212 that extends between the opposite facing top and bottom surfaces 236, 234 of the mold compound 212. the leads 206 from the first plurality and the leads 206 from the second plurality. The conductive tracks 116 form direct electrical connections between the leads 206 from the first plurality 207 that is associated with the first lead frame 222 and the leads 206 from the second plurality 209 that is associated with the second lead frame 224.

According to the depicted embodiment, one of the conductive tracks 216 forms a direct electrical connection between the second lead 206b in the second plurality 209 that is electrically connected to the second terminal of the second semiconductor die 203 and one the second leads 206 in the first plurality that is electrically disconnected from the second semiconductor die 202. In this way, electrical access to the terminals of the second semiconductor die 203 can be provided at the bottom side 214 of the mold compound 212. Thus, electrical access to all terminals of the first and second semiconductor dies 202, 203 can be provided at the bottom side 214 of the mold compound 212.

According to another embodiment (not shown), one of the conductive tracks 216 forms a direct electrical connection between the second lead 206b in the second plurality 209 that is electrically connected to the second terminal of the second semiconductor die 203 and the first lead 206a in the first plurality 207 that is electrically connected to the first terminal of the first semiconductor die 202. In this way, the conductive track 216 is used to form a direct electrical connection between the terminals of the first and second semiconductor dies 202, 203. Referring to FIG. 10, first and second packaged semiconductor devices 300, 301 are provided. Each one of the first and second packaged semiconductor devices 300, 301 can have any of the configurations of the packaged semiconductor device 100 described with reference to FIG. 1 or the package configuration described with reference to FIGS. 7-9. In the depicted embodiment, the first packaged semiconductor device 300 is a so-called QF (quad flat) package with externally accessible leads on a lower side of the package that are coplanar with the molding material. In addition, the second packaged semiconductor device 301 so-called surface mount package with externally accessible leads that protrude away from a side of the molding material. According to another embodiment (not shown), the first packaged semiconductor device 300 can be substantially similar or identical to the packaged semiconductor device 200 described with reference to FIGS. 7-9 with leads disposed on top and bottom sides of the package and multiple semiconductor dies encapsulated within the package.

Conductive tracks 316 are formed in the mold compound 312 of the first packaged semiconductor device 300. These conductive tracks 316 may be formed using the laser structuring and electroless plating process as previously described with reference to FIGS. 3-6. The conductive tracks 316 are formed to extend from some of the leads 306 of the first packaged semiconductor device 300 to the die attachment site 340. These conductive tracks 316 may contact "unassigned" leads 306, i.e., leads 306 that are disconnected from the semiconductor die (or dies) that is packaged within the first packaged semiconductor device 300. Alternatively, these conductive tracks 316 may contact leads 306 that are connected to the terminals of the semiconductor die (or dies) that is packaged within the first packaged semiconductor device 300.

The second packaged semiconductor device 301 is attached to the first packaged semiconductor device 300 such that the outer surface of the mold compound 312 from the first packaged semiconductor device 300 is flush against the mold compound 314 from the second packaged semiconductor device 301. In particular, a lower side (not shown) of the mold compound 314 from the second packaged semiconductor device 301 is flush against the die attachment site 340 on the mold compound 312 from the first packaged semiconductor device 300.

The attachment of the second packaged semiconductor device 301 to the first packaged semiconductor device 300 can be done using a solder technique. For example, a solder material can be screen printed on the mold compound 312 of the first packaged semiconductor device 300 to form a metallized pad in the die attachment site 340. Subsequently, a pick-and-place technique is utilized to place the second packaged semiconductor device 300 on the metallized pad 340. Subsequently, a reflow process is performed to melt the solder and complete the adhesion between the first and second packaged semiconductor devices 300, 301.

Advantageously, the conductive tracks 316 enable a compact, stacked package design wherein the first and second packaged semiconductor devices 300, 301 are flush against one another. No interposer is required for electrical access to the second packaged semiconductor device 301. Instead, the conductive tracks 316 enable electrical access to the leads 306 of the second packaged semiconductor device 301 from the leads 306 of the first packaged semiconductor device 300. Thus, the terminals of the semiconductor die (or dies) in the second packaged semiconductor device 301 can be electrically accessed from a printed circuit board that directly contacts the leads 306 of the first packaged semiconductor device 300 using the "unassigned" leads 306 of the first packaged semiconductor device 300. Further, the terminals of the semiconductor die (or dies) in the second packaged semiconductor device 301 can be directly electrically connected to the terminals of the semiconductor die (or dies) in the first packaged semiconductor device 300 using the connected leads 306 of the first packaged semiconductor device 300.

The stacked package configuration shown in FIG. 10 represents just one of a variety of potential configurations that are made possible by the conductive tracks 316 described herein. For example, one or both sides of the first packaged semiconductor device 300 can accommodate multiple ones of the second packaged semiconductor devices 301. In the case of multiple ones of the second packaged semiconductor devices 301 affixed to a single first packaged semiconductor device 300, the conductive tracks 316 can be used to connect these multiple second packaged semiconductor devices 301 to one another, as well as to the leads 306 of the first packaged semiconductor device 300. In the embodiments described herein, a packaged semiconductor device 100 is used as an exemplary packaged device that is suitable for the formation of conductive tracks 116 in the mold body (i.e., the portion of the device that includes the electrically insulating mold compound 112) according to the activation and electroless plating techniques described herein. The disclosed package design represents just one examples of a wide variety of packaged devices that are suitable for this technique. More generally, the conductive track structures and corresponding methods for forming the conductive tracks are applicable to a wide variety of package designs and materials. These packages can be so-called open air cavity style packages wherein the semiconductor dies and associated electrical connections are provided within an open air cavity that is enclosed by an electrically insulating mold compound and a protective lid. Alternatively, these packages can be so-called molded packages (e.g., as depicted), wherein the mold compound is formed directly around the semiconductor dies and associated electrical connections. These packages can be so-called leaded packages wherein the electrically conductive leads protrude away from the outer surface of the mold compound so as to enable insertion of the lead into a receptacle, e.g., a socket of a printed circuit board. Alternatively, these packages can be so-called leadless packages (e.g., as depicted) wherein the exposed surfaces of the leads are coplanar with the mold compound. Exemplary packages types that are suitable for the conductive track structures and corresponding methods for forming the conductive tracks include the DIP (dual in-line package) style packages, TO (transistor outline) style packages, QFP (quad-flat-package) style packages, surface mount style packages, etc., to name a few.

The term "electrically connected" as used herein describes a permanent low-ohmic, i.e., low-resistance, connection between electrically connected elements, for example a wire connection between the concerned elements. By contrast, the term "electrically coupled" contemplates a connection in which there is not necessarily a low-resistance connection and/or not necessarily a permanent connection between the coupled elements. For instance, active elements, such as transistors, as well as passive elements, such as inductors, capacitors, diodes, resistors, etc., may electrically couple two elements together.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic circuit, comprising:
  a first packaged semiconductor device comprising a first semiconductor die comprising a first terminal, a first electrically conductive lead that is electrically connected to the first terminal, and a first electrically insulating mold compound that encapsulates the first semiconductor die and exposes an end portion of the first lead at an outer surface of the first mold compound;
  a conductive track formed in the outer surface of the first mold compound; and
  a second packaged semiconductor device, the second packaged semiconductor device comprising a second semiconductor die having a second terminal, a second electrically conductive lead that is electrically connected to the second terminal, and a second electrically insulating mold compound that encapsulates the second packaged semiconductor device and exposes an end portion of the second lead at an outer surface of the second mold compound,
  wherein the second packaged semiconductor device is attached to the first packaged semiconductor device such that the outer surface of the second mold compound is flush against the outer surface of the first mold compound,
  wherein the conductive track electrically connects the end portion of the first lead to the end portion of the second lead, and
  wherein the second packaged semiconductor device has a different package configuration as the first packaged semiconductor device.

2. The electronic circuit of claim 1, wherein the first electrically insulating mold compound comprises a multi-layer exterior compound comprising: a metallic ion containing layer, a hydrophilic layer disposed on the metallic ion containing layer, and a hydrophobic layer disposed on the hydrophilic layer.

3. The electronic circuit of claim 2, wherein the conductive track is formed in a recessed channel that is formed in the hydrophilic layer and the hydrophobic layer and extends to the metallic ion containing layer.

4. The electronic circuit of claim 1, wherein the second packaged semiconductor device comprises a second plurality of electrically conductive leads that are exposed from the second mold compound, and wherein the second lead is included in the second plurality, and wherein forming the conductive track in the outer surface comprises forming a direct electrical connection between the first lead and one of the leads in the second plurality.

5. The electronic circuit of claim 1, wherein the second packaged semiconductor device is mounted on top of the first packaged semiconductor device with the exposed portion of the second lead contacting the outer surface of the first mold compound, wherein the conductive track electrically connects the exposed portion of the second lead to the exposed portion of the first lead, and wherein the mold compound that encapsulates the first semiconductor die comprises a metallic ion containing layer.

6. The electronic circuit of claim 1, wherein the end portion of the first lead from the first semiconductor package is exposed at a lower surface of the first mold compound, wherein the second packaged semiconductor device is mounted on an upper surface of the first mold compound that is opposite from the lower surface of the first mold compound, and wherein the upper surface of the first mold compound is devoid of electrically conductive leads from the first packaged semiconductor device or via structures connected to the leads from the first packaged semiconductor device.

7. The electronic circuit of claim 6, wherein the second packaged semiconductor device is smaller than the first semiconductor package, and wherein the conductive track extends across an area of the upper surface of the first mold compound that is uncovered from the second packaged semiconductor device.

* * * * *